(12) United States Patent
Kopp et al.

(10) Patent No.: US 10,777,708 B2
(45) Date of Patent: Sep. 15, 2020

(54) OPTOELECTRONIC SEMICONDUCTOR CHIP AND METHOD OF PRODUCING AN OPTOELECTRONIC SEMICONDUCTOR CHIP

(71) Applicant: OSRAM OLED GmbH, Regensburg (DE)

(72) Inventors: Fabian Kopp, Penang (MY); Attila Molnar, Gelugor (MY)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/462,349

(22) PCT Filed: Dec. 12, 2017

(86) PCT No.: PCT/EP2017/082439
§ 371 (c)(1),
(2) Date: May 20, 2019

(87) PCT Pub. No.: WO2018/114483
PCT Pub. Date: Jun. 28, 2018

(65) Prior Publication Data
US 2019/0341526 A1   Nov. 7, 2019

(30) Foreign Application Priority Data
Dec. 19, 2016   (DE) .................... 10 2016 124 860

(51) Int. Cl.
*H01L 33/38*   (2010.01)
*H01L 33/46*   (2010.01)
(Continued)

(52) U.S. Cl.
CPC .......... *H01L 33/382* (2013.01); *H01L 33/007* (2013.01); *H01L 33/46* (2013.01);
(Continued)

(58) Field of Classification Search
CPC ..... H01L 33/382; H01L 33/007; H01L 33/46; H01L 33/32; H01L 2933/0016; H01L 33/0025; H01L 33/405
(Continued)

(56) References Cited

U.S. PATENT DOCUMENTS

2012/0168809 A1   7/2012   Maute et al.
2012/0241720 A1*  9/2012   Totani ................... H01L 33/387
257/13
(Continued)

FOREIGN PATENT DOCUMENTS

DE   10 2009 023 849 A1   12/2010
DE   10 2015 107 577 A1   11/2016
(Continued)

*Primary Examiner* — Tong-Ho Kim
(74) *Attorney, Agent, or Firm* — DLA Piper LLP (US)

(57) ABSTRACT

An optoelectronic semiconductor chip includes a semiconductor layer sequence, a transparent substrate, at least one contact trench, at least one insulating trench, at least one current distribution trench, at least in the insulating trench, an electrically insulating mirror layer that reflects radiation generated in an active layer, at least one metallic current web in the contact trench configured for a current conduction along the contact trench and supplying current to a first semiconductor region, and at least one metallic busbar in the current distribution trench that energizes a second semiconductor region, wherein the contact trench, the isolating trench and the current distribution trench extend from a side of the second semiconductor region facing away from the substrate through the active layer into the first semiconductor region, and the contact trench is completely surrounded by the insulating trench, and the current distribution trench lies only outside the insulating trench.

17 Claims, 8 Drawing Sheets

(51) Int. Cl.
  *H01L 33/00* (2010.01)
  *H01L 33/32* (2010.01)
  *H01L 33/40* (2010.01)

(52) U.S. Cl.
  CPC ............ *H01L 33/32* (2013.01); *H01L 33/405* (2013.01); *H01L 2933/0016* (2013.01); *H01L 2933/0025* (2013.01)

(58) Field of Classification Search
  USPC .......................................................... 257/98
  See application file for complete search history.

(56) References Cited

U.S. PATENT DOCUMENTS

| | | | |
|---|---|---|---|
| 2017/0236977 A1 | 8/2017 | Oh et al. | |
| 2018/0108811 A1* | 4/2018 | Kopp | H01L 33/145 |
| 2019/0103520 A1 | 4/2019 | Kopp et al. | |

FOREIGN PATENT DOCUMENTS

| | | |
|---|---|---|
| DE | 10 2016 105 056 A1 | 9/2017 |
| WO | 2016/021919 A1 | 2/2016 |
| WO | 2016/180779 A1 | 11/2016 |

\* cited by examiner

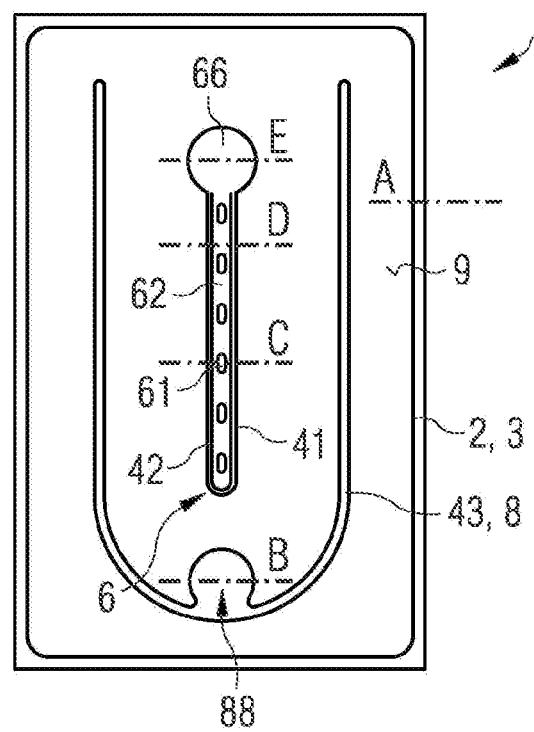
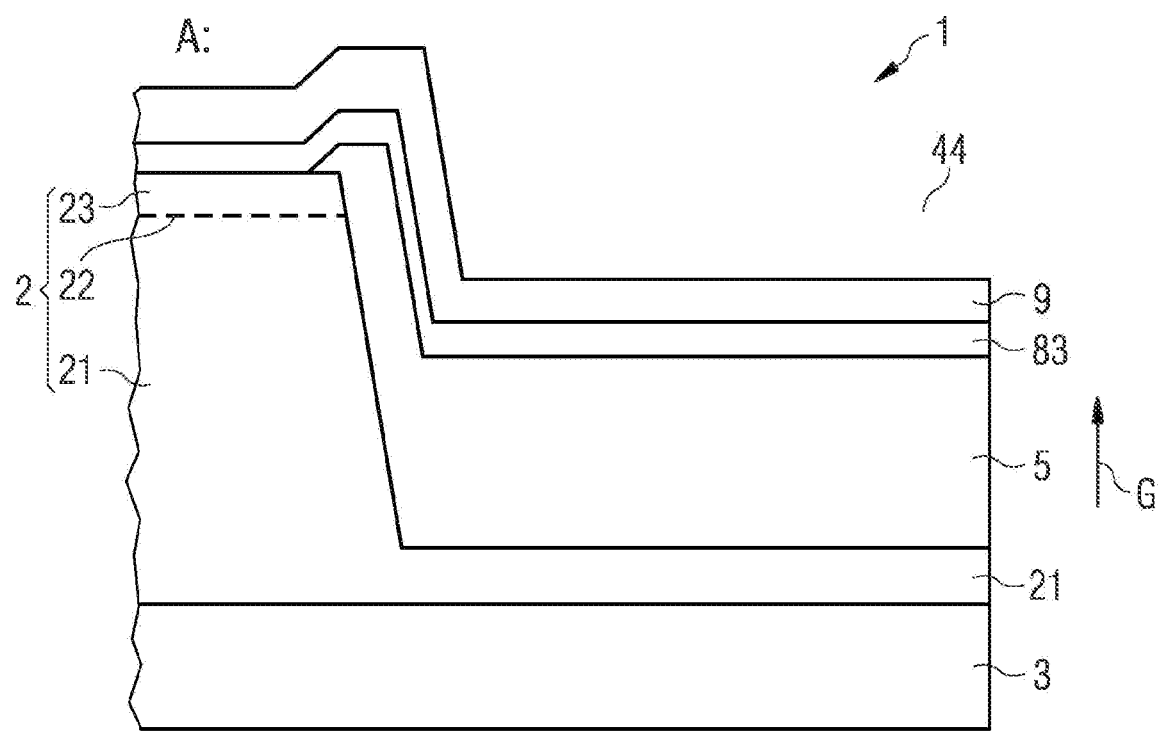

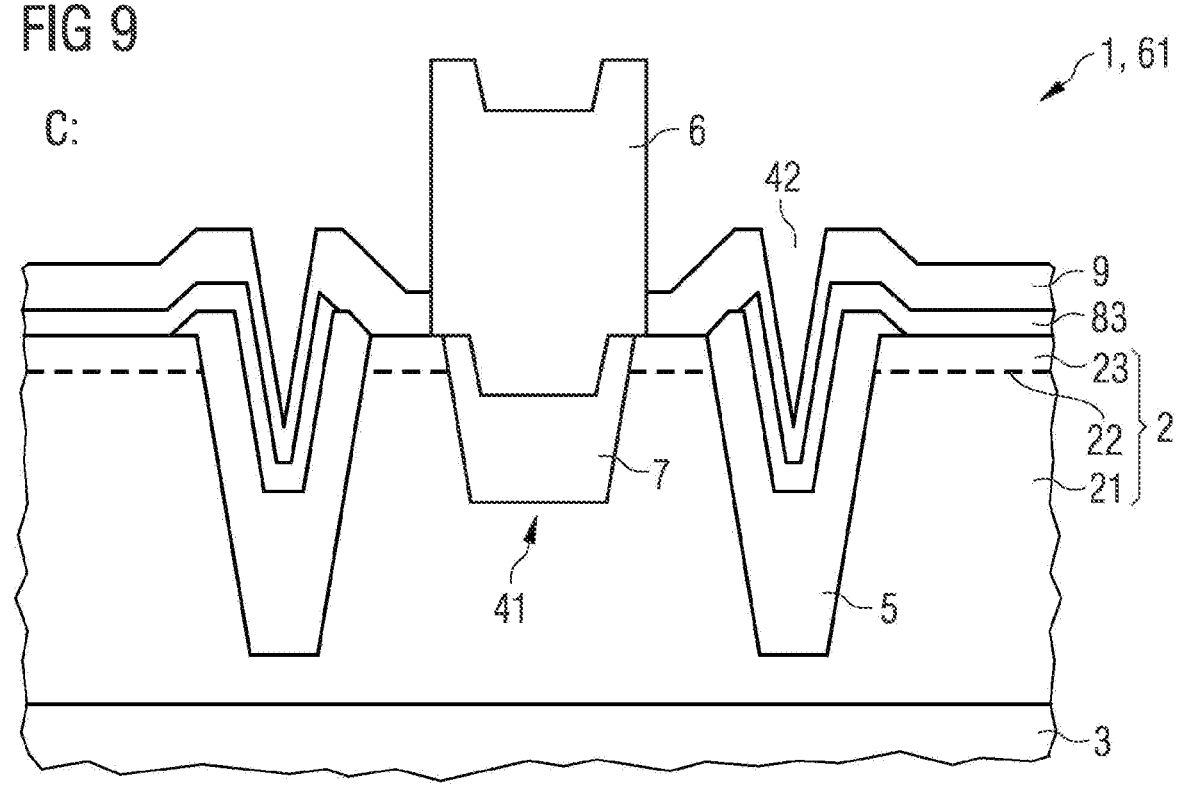
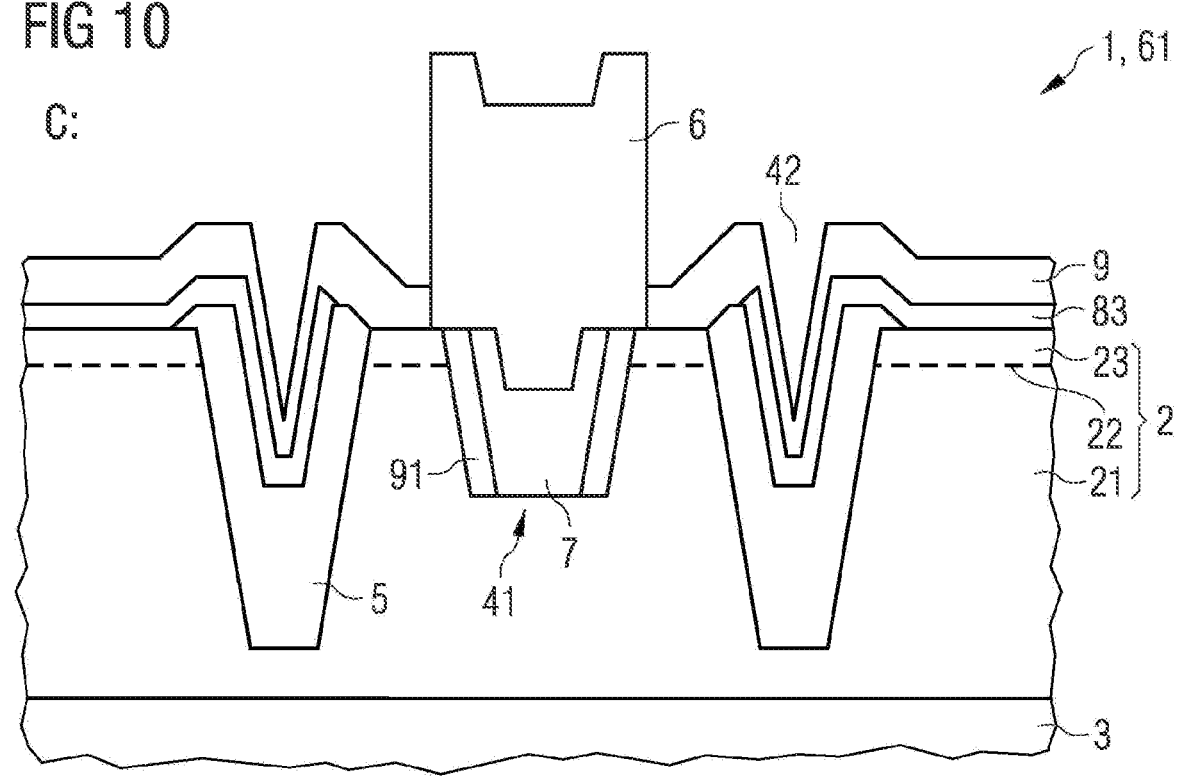

FIG 11
A)
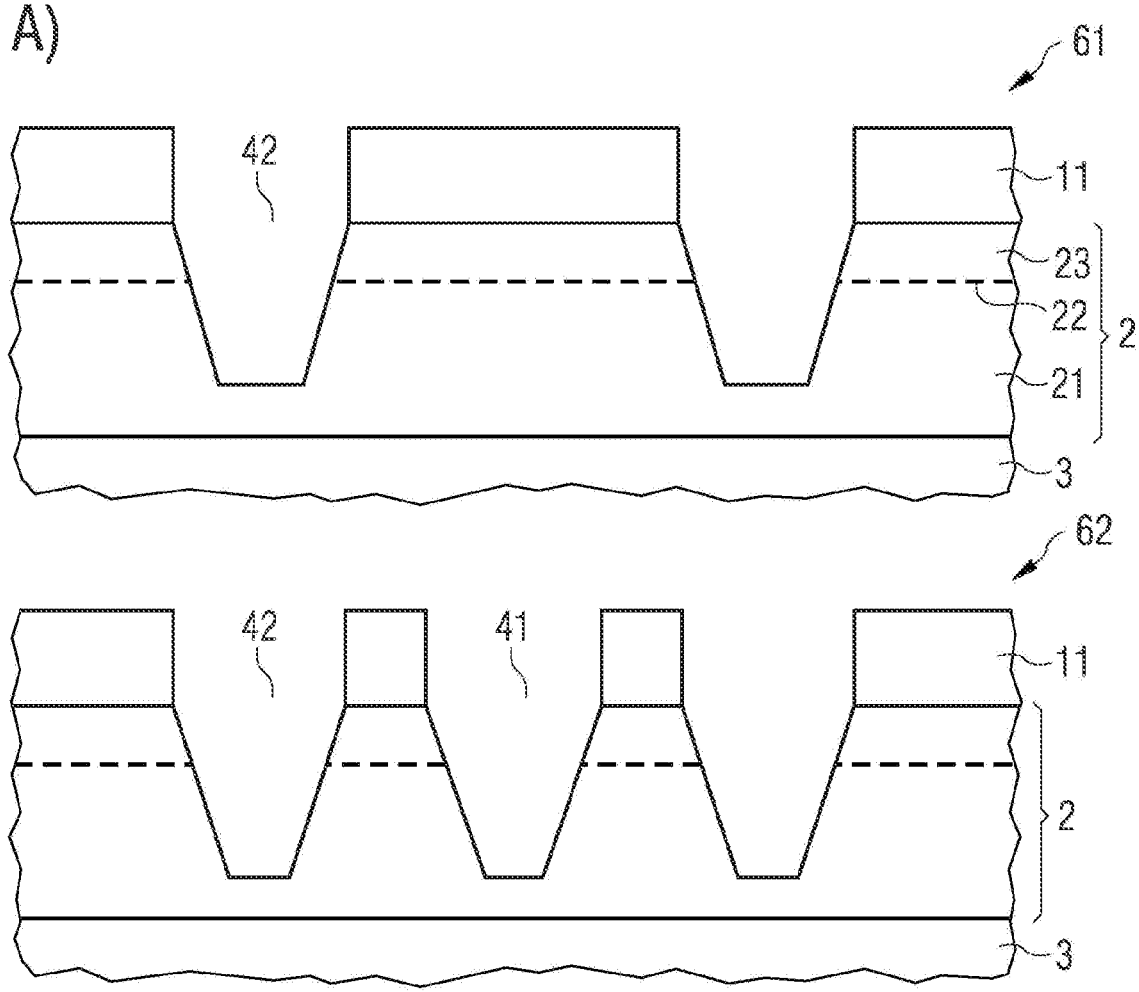
B)
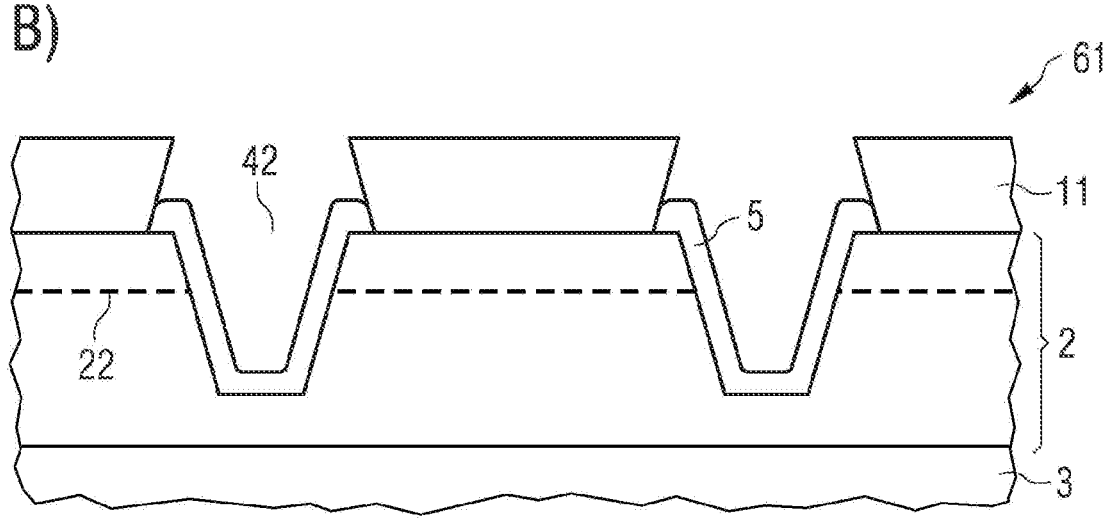

FIG 11
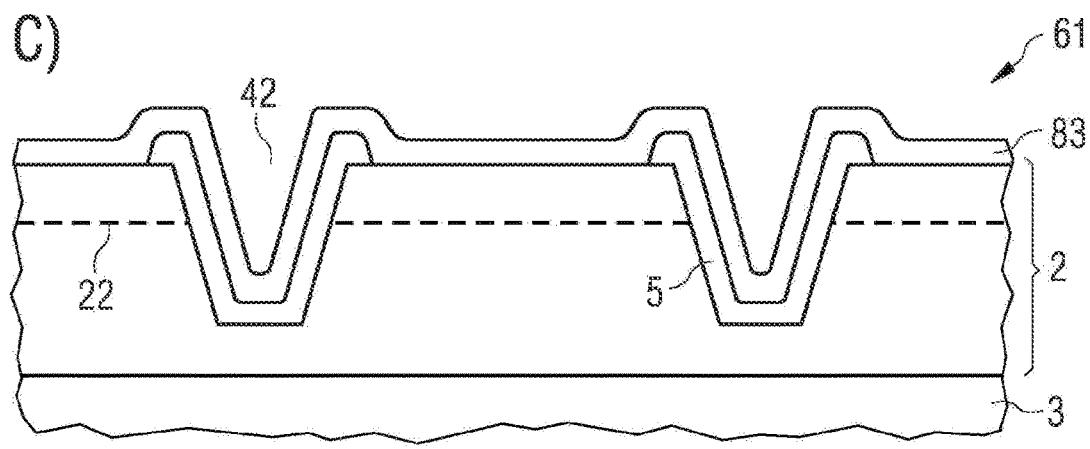
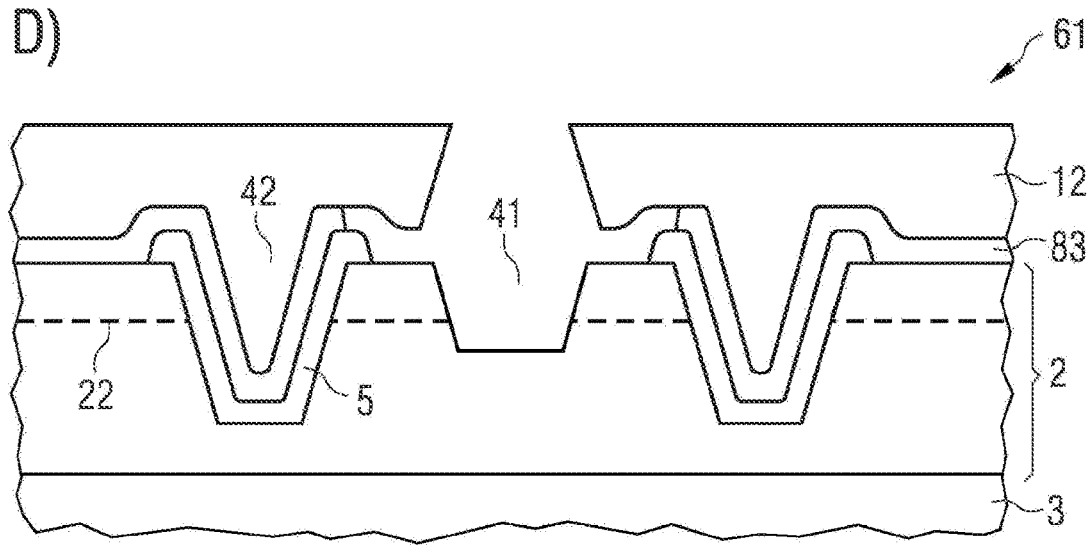
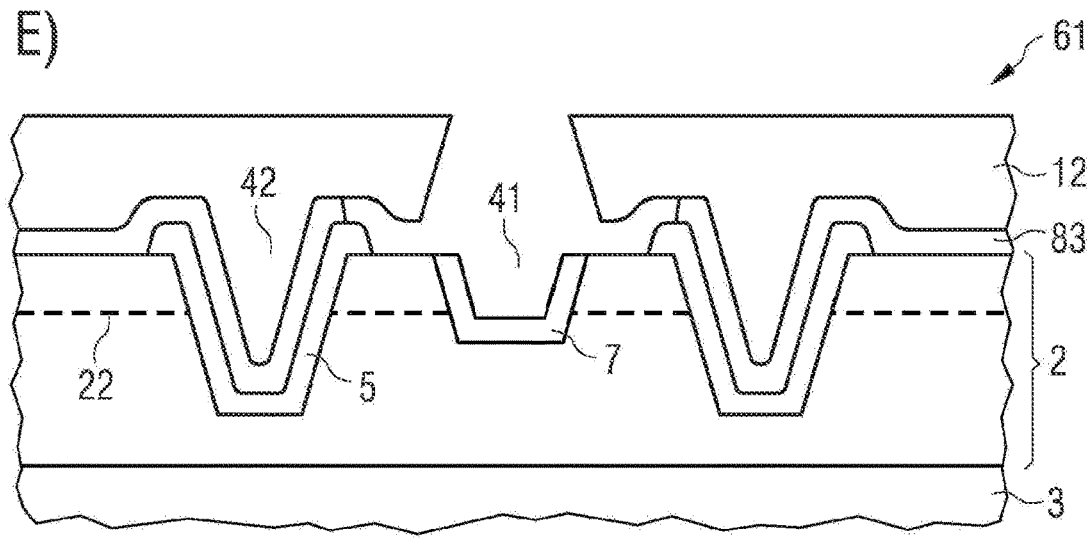

FIG 11
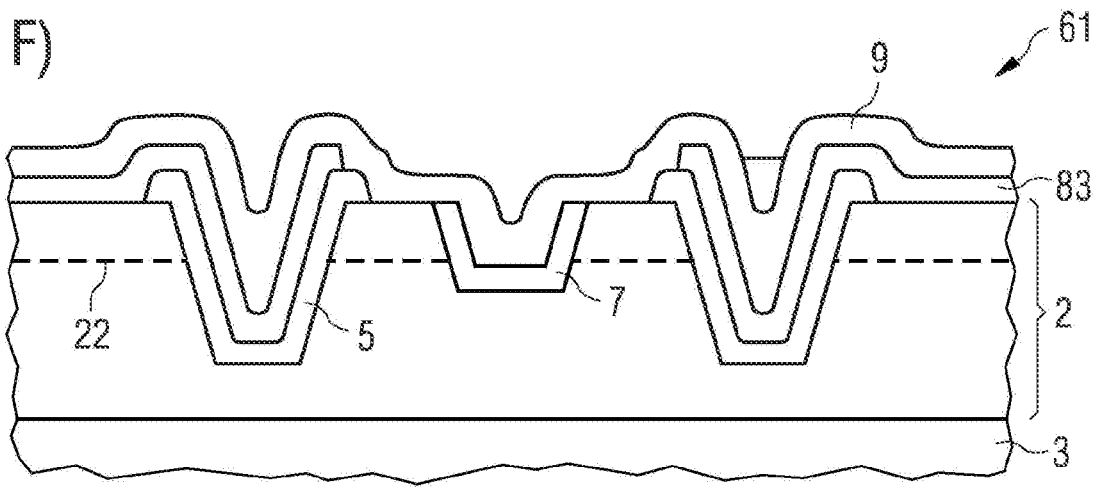
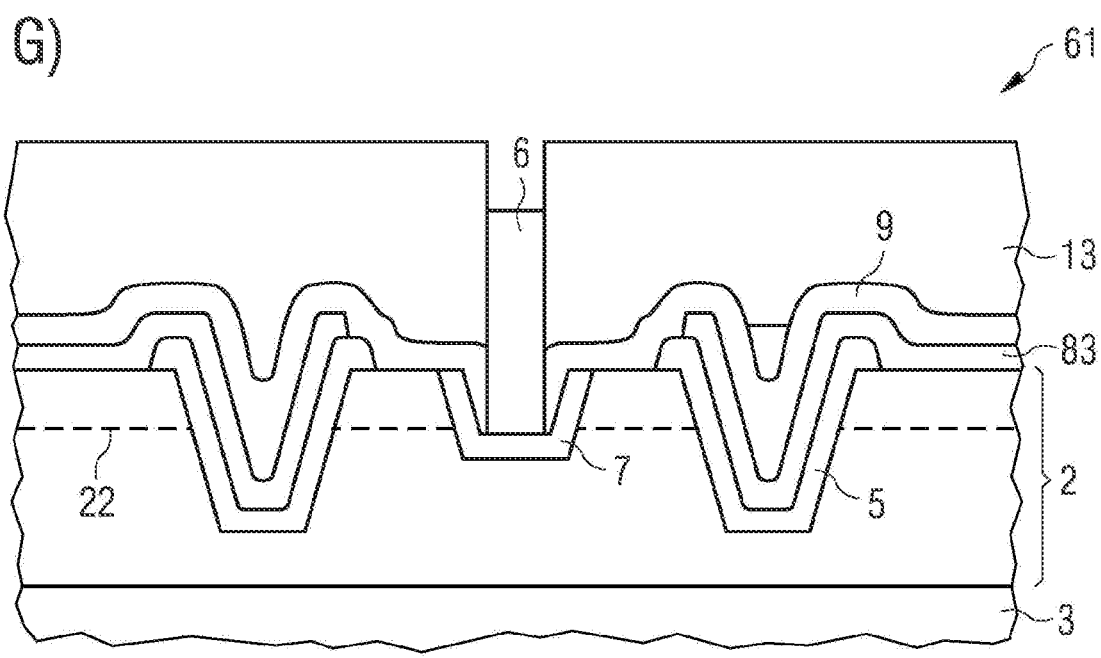

OPTOELECTRONIC SEMICONDUCTOR CHIP AND METHOD OF PRODUCING AN OPTOELECTRONIC SEMICONDUCTOR CHIP

TECHNICAL FIELD

This disclosure relates to an optoelectronic semiconductor chip and a method of producing an optoelectronic semiconductor chip.

BACKGROUND

There is a need to provide an optoelectronic semiconductor chip that can be produced efficiently and offers a high luminous efficiency.

SUMMARY

We provide an optoelectronic semiconductor chip including a semiconductor layer sequence having an active layer that generates radiation between a first and a second semiconductor region, a transparent substrate on which the semiconductor layer sequence is located, at least one contact trench, at least one insulating trench, at least one current distribution trench, at least in the insulating trench, an electrically insulating mirror layer that reflects radiation generated in the active layer, at least one metallic current web in the contact trench configured for a current conduction along the contact trench and supplying current to the first semiconductor region, and at least one metallic busbar in the current distribution trench that energizes the second semiconductor region, wherein the contact trench, the isolating trench and the current distribution trench extend from a side of the second semiconductor region facing away from the substrate through the active layer into the first semiconductor region, and the contact trench is completely surrounded by the insulating trench, and the current distribution trench lies only outside the insulating trench.

We also provide a method of producing an optoelectronic semiconductor chip including in order:

A) providing a transparent substrate and growing a semiconductor layer sequence on the substrate, wherein the semiconductor layer sequence has an active layer that generates radiation between a first and a second semiconductor region, B) producing a first mask layer on the semiconductor layer sequence and etching of an insulating trench and of a current distribution trench, C) applying an electrically insulating mirror layer in the insulating trench and in the current distribution trench, the mirror layer is configured to reflect light generated in the active layer during operation, D) removing the first mask layer and applying a current spreading layer over the whole area for the second semiconductor region, E) producing a second mask layer and etching a contact trench which, like the insulating trench and the current distribution trench, extends from a side of the second semiconductor region facing away from a substrate through the active layer into the first semiconductor region so that the contact trench is completely surrounded by the insulating trench, and the current distribution trench lies only outside the insulating trench, F) removing the current spreading layer from a region directly at the contact trench, G) removing the second mask layer and producing a passivation layer, H) producing a third mask layer and removing the passivation layer in places and applying a metallic current web in the contact trench, wherein the current web is configured for a current guidance along the contact trench and supplies current to the first semiconductor region and at the same time applies a metallic busbar in the current distribution trench, and the busbar is configured for a current distribution along the current distribution trench and for current supplied to the second semiconductor region.

BRIEF DESCRIPTION OF THE DRAWINGS

FIG. 1 shows a schematic plan view of an example of an optoelectronic semiconductor chip.

FIGS. 2 to 10 show schematic sectional representations of examples of optoelectronic semiconductor chips.

FIGS. 11A to 11G show schematic sectional representations of method steps of a production method for an optoelectronic semiconductor chip.

Figure 3:
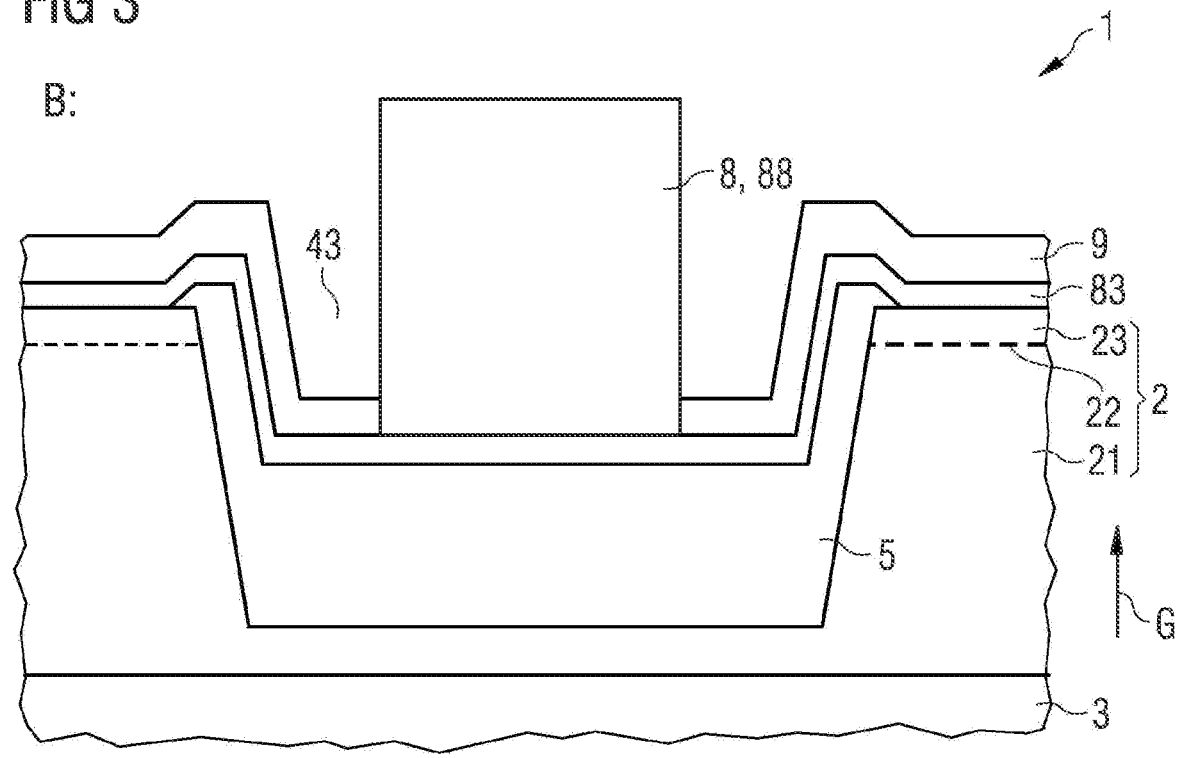

LIST OF REFERENCE SIGNS 1 optoelectronic semiconductor chip
2 semiconductor layer sequence
21 first semiconductor region/n-side
22 active layer
23 second semiconductor region/p-side
3 light-transmissive substrate/sapphire
41 contact trench
42 insulating trench
43 current distribution trench
44 edge trench
5 mirror layer
6 current web for the n-side
61 contact field
62 isolator panel
66 bonding region for the n-side
7 contact layer
8 busbar for the p-side
83 current spreading layer for the p-side
88 bonding region for the p-side
9 passivation layer
91 further passivation layer
11 first mask layer for the second mirror layer
12 second mask layer for the contact trench
13 third mask layer for the contact layer
G growth direction of the semiconductor layer sequence

DETAILED DESCRIPTION

Our optoelectronic semiconductor chip has a semiconductor layer sequence. The semiconductor layer sequence comprises one or more active layers that generates radiation, in particular generate visible light such as blue light. The active layer is located between a first semiconductor region and a second semiconductor region. The first semiconductor region is preferably an n-conducting n-side and the second semiconductor region is in particular a p-conducting p-side. In the following, the first and the second semiconductor region are respectively explained with this charge carrier conductivity. In the same way, the first and the second semiconductor regions can have the reverse charge carrier conductivities.

The optoelectronic semiconductor chip is preferably a light-emitting diode, LED for short.

The semiconductor layer sequence may be based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$ or $Al_nGa_mIn_{1-n-m}As_kP_{1-k}$, wherein in each case $0 \leq n \leq 1$, $0 \leq m \leq 1$ and $n+m \leq 1$ and $0 \leq k < 1$. Preferably, the following applies to at least one layer or to all layers of the semiconductor layer sequence: $0 < n \leq 0.8$, $0.4 \leq m < 1$ and $n+m \leq 0.95$ as well as $0 < k \leq 0.5$, wherein the semiconductor layer sequence can have dopants and additional components. For the sake of simplicity, however, only essential components of the crystal lattice of the semiconductor layer sequence are mentioned, that is, Ga, In, N or P, even if they can be partially replaced and/or supplemented by small quantities of further substances. The semiconductor layer sequence is particularly preferably based on the material system AlInGaN.

The at least one active layer comprises in particular at least one pn junction and/or at least one quantum well structure. A radiation generated by the active layer during operation has, for example, a wavelength of maximum intensity of at least 400 nm or 425 nm and/or of at most 480 nm or 800 nm.

The semiconductor layer sequence may be located on a transparent substrate. The substrate is permeable, preferably transparent, in particular for radiation generated in the active layer. The semiconductor layer sequence is furthermore preferably grown directly on the substrate so that the substrate is a growth substrate. For example, the substrate is a silicon carbide substrate, a gallium nitride substrate, a silicon substrate or preferably a sapphire substrate.

In this example, the first semiconductor region is located closer to the substrate than the second semiconductor region. The active layer is preferably oriented perpendicular to a growth direction of the semiconductor layer sequence and perpendicular to a main side of the substrate on which the semiconductor layer sequence is applied.

The semiconductor chip may comprise one or more insulating trenches. The at least one insulating trench extends from the side of the second semiconductor region remote from the substrate through the active layer into the first semiconductor region. In particular, the insulating trench divides the active layer, seen in a plan view. The insulating trench is configured to avoid electrical short circuits between regions located within a frame formed by the insulating trench and regions of the second semiconductor region located outside this frame. A continuous connection is provided within the first semiconductor region under the insulating trench. That is, the insulating trench does not extend as far as the substrate.

The semiconductor chip may have one or more contact trenches. The at least one contact trench extends from a side of the second semiconductor region remote from the substrate through the active layer into the first semiconductor region. Via the contact trench, the first semiconductor region can be electrically contacted from a side of the second semiconductor region facing away from the substrate.

The optoelectronic semiconductor chip may comprise one or more current distribution trenches. The at least one current distribution trench is configured to allow a lateral current distribution across the second semiconductor region. The current distribution trench also extends from the side of the second semiconductor region remote from the substrate through the active layer into the first semiconductor region.

The semiconductor chip may comprise one or more metallic current webs. The at least one current web is mounted in the contact trench. The current web conducts current along the contact trench and energizes the first semiconductor region. It is possible for the current web to be in direct contact with the first semiconductor region or that the current web is continuously distant from the first semiconductor region.

The semiconductor chip may have a mirror layer. The mirror layer is preferably electrically insulating. Furthermore, the mirror layer reflects radiation generated in the active layer during operation. The mirror layer can be formed from a single layer or composed of a plurality of partial layers. Such partial layers preferably follow one another directly along the growth direction of the semiconductor layer sequence. In particular, the mirror layer is a dielectric mirror or distributed Bragg reflector, DBR in short. The mirror layer is constructed, for example, as specified in WO 2016/180779 A1, the subject matter with regard to the mirror layer is incorporated herein by reference.

The semiconductor chip may comprise one or more current webs. The at least one current web is preferably a metallic web, this means, in particular, that the current web consists of one or more metals and is ohmically conductive.

The current web may be partially or completely located in the contact trench. Viewed in a plan view, the current web preferably lies completely within the contact trench. In the direction parallel to the growth direction of the semiconductor layer sequence, the current web can lie completely in the contact trench. Preferably, the current web projects beyond the contact trench and the semiconductor layer sequence in the direction away from the substrate.

The current web may be configured to conduct current along the contact trench. The first semiconductor region can be supplied with electric current via the current web. The current web preferably has a length along a longitudinal direction that exceeds a mean width of the current web by at least a factor of 10 or 20 or 30 and/or by at most a factor of 200 or 100 or 50. In other words, the current web is formed in an elongated manner. For example, the current web has dimensions of approximately 3 µm×500 µm.

The semiconductor chip may comprise one or more current rails, also referred to as busbars. The at least one busbar is preferably a metallic rail. Metallic means in particular that the busbar consists of one or more metals and is ohmically conductive. The busbar, like the current web, is impermeable to radiation generated during operation of the semiconductor chip. The metallic busbar is mounted in the current distribution trench and energizes the second semiconductor region.

The contact trench may be completely surrounded by the insulating trench. This means, in particular, that there is no continuous connection via the second semiconductor region and/or via the active layer from a region surrounded by the insulating trench to an outer region outside the frame formed by the insulating trench. In this example, the contact trench is located within the enclosed region.

The current distribution trench may lie outside the insulating trench, in particular exclusively outside the insulating trench. In other words, the contact trench and the current distribution trench are separated from one another by the insulating trench. The insulating trench ensures that there is no direct electrical connection between the contact trench and the current distribution trench. The term 'direct electrical connection' preferably relates to an ohmically conductive connection so that in this example an electrically conductive connection via the semiconductor layer sequence is not to be regarded as a direct electrical connection.

The optoelectronic semiconductor chip may comprise a semiconductor layer sequence having an active layer that generates radiation between a first and a second semiconductor region. The semiconductor layer sequence is located on a transparent substrate. The semiconductor chip further comprises at least one contact trench, at least one insulating trench and at least one current distribution trench. An electrically insulating mirror layer reflects radiation generated in the active layer. The mirror layer is located at least in the insulating trench. At least one metallic current web is mounted in the contact trench and conducts current along the contact trench and energizes the first semiconductor region. At least one metallic busbar is located in the current distribution trench, is configured to conduct current along the current distribution trench and supplies current to the second semiconductor region. The contact trench, the insulating trench and the current distribution trench each extend from a side of the second semiconductor region remote from the substrate through the active layer into the first semiconductor region in the direction towards the substrate. The contact trench is completely surrounded by the insulating trench and the current distribution trench lies only outside the insulating trench.

One of the most-produced types of light-emitting diodes are so-called "sapphire volume emitters." In such devices, a semiconductor layer sequence based on AlInGaN is grown on a sapphire substrate. The light-emitting diodes generate blue light emitted via side surfaces of the substrate and via an upper side of the substrate facing away from the semiconductor layer sequence. Metal contacts for current injection are located on the semiconductor layer sequence. Further layers are preferably located between an underside of the metal contacts facing the semiconductor layer sequence and the semiconductor layer sequence, for example, mirror layers or current spreading layers. Such light-emitting diodes are used, for example, to generate white light in combination with a phosphor such as YAG:Ce.

In such light-emitting diodes, the higher a reflection coefficient at the electrical metal contacts, the lower the absorption at the contacts and thus brightness losses. Furthermore, the more photo layers are used in the production process of the optoelectronic semiconductor chip, in particular to increase reflection coefficients at the contacts, the higher production costs arise.

With our semiconductor chip and our method, a high reflection at the electrical contacts can be achieved on the one hand. On the other hand, only three photo layers are required to produce the semiconductor chip. This results in a semiconductor chip having a high light output efficiency at comparatively low production costs.

This is achieved in particular in that the semiconductor chip has a first trench with the mirror layer, wherein the first trench in the form of the isolating trench forms a closed frame around the contact trench. The contact trench comprises an electrical contact for the first semiconductor region. A distance between the contact trench and the insulating trench is selected to be as small as possible to ensure the largest possible area of the active layer outside the frame which is available to generate radiation.

The mirror layer may be located in the insulating trench. In particular, the mirror layer covers the insulating trench predominantly or completely, as seen in a plan view.

The mirror layer may be applied directly to the first semiconductor region. The first semiconductor region is electrically isolated from the substrate in the direction away from the substrate via the mirror layer.

The mirror layer may extend out of the insulating trench in places or over the whole area. In this example, the mirror layer preferably predominantly or completely covers side walls of the insulating trench. In particular, the mirror layer extends out of the insulating trench to the side of the second semiconductor region facing away from the substrate. In this example, the side of the second semiconductor region is only slightly covered by the mirror layer, for example, to at most 10% or 5% or 2% and/or to at least 0.1% or 0.5%.

The semiconductor chip may comprise one or more electrical contact layers. The electrical contact layer is at least in places in direct contact with the first semiconductor region, and in direct contact with the current web. The contact layer impresses current into the first semiconductor region. The contact layer can be formed by a single layer or can be composed of a plurality of partial layers.

The contact layer may be composed of exactly two or exactly three or exactly four partial layers. In particular, a semiconductor contact layer is present, which is located directly on the first semiconductor region and preferably formed by exactly one layer. The semiconductor contact layer preferably comprises one or more of the following materials or consists of one or more of these materials: Cr, Ag, Mo, Ni, Ti, ZnO, ITO. Furthermore, a thickness of the semiconductor contact layer is preferably at least 0.1 nm or 0.5 nm or 1 nm and/or at most 5 nm or 30 nm or 100 nm.

The contact layer may comprise a reflection layer. The reflection layer preferably follows the semiconductor contact layer directly and is preferably formed by exactly one layer. In particular, the contact layer consists of the reflection layer together with the semiconductor contact layer. Furthermore, the reflection layer and the semiconductor contact layer are preferably arranged congruently one above the other. The reflection layer preferably comprises one or more of the following materials or consists of one or more of these materials: Ag, Al, Al:Cu, Rh, Pd, Pt, TCO layer such as ITO. A thickness of the reflection layer is preferably at least 10 nm or 20 nm or 30 nm and/or at most 100 nm or 200 nm or 500 nm.

The contact layer may contain a barrier layer. The barrier layer is preferably applied directly on the reflection layer, on a side facing away from the semiconductor layer sequence. The optional barrier layer is preferably a metal layer. In particular, the barrier layer comprises one or more of the following materials or consists of one or more of these materials: Ti, Pt, Au, Ni, Rh, Ru. The thickness of the barrier layer is preferably at least 1 nm or 4 nm or 20 nm and/or at most 200 nm or 100 nm. The barrier layer is preferably composed of two partial layers, for example, a Ti partial layer and a Pt partial layer, but can also have more than two partial layers.

The contact layer may extend from a base area of the contact trench over side areas of the contact trench to the second semiconductor region. That is, the side faces of the contact trench are partially or completely covered directly by the contact layer. The contact layer is in particular in direct contact with the active layer and/or the second semiconductor region. The contact layer is preferably a metallic layer, in particular a reflective layer. Furthermore, the contact layer is preferably located directly on the base surface of the contact trench, wherein the base surface is covered, in particular, only partly by the contact layer.

The contact layer may be restricted to the contact trench at least along the current web. That is, along the current web the contact layer is located only within the contact trench.

The current web may have a plurality of contact fields and a plurality of isolator fields along the longitudinal direction and are arranged alternately in succession. In the isolator fields, no current is impressed from the current web into the semiconductor layer sequence. In contrast, the contact fields supply current to the semiconductor layer sequence, that is, to the first semiconductor region. Thus, no current is impressed into the second semiconductor region along the entire length of the current web.

The contact layer may be attached directly to the current web. This means that a current flow takes place via the current web to the contact layer and from the latter into the first semiconductor region. The contact layer is preferably limited to the respective contact field, a connection between adjacent contact fields thus does not take place by a material of the contact layer itself, but electrically directly preferably exclusively via the current web. The electrically conductive connection preferably relates to an ohmically conductive connection so that in this example an electrically conductive connection via the semiconductor layer sequence is not to be regarded as a direct electrical connection.

The isolator fields may be free of the contact layer. In particular, the contact layer is limited to the contact fields. The mirror layer between the current web and the first semiconductor region is located in the isolator fields. In other words, an electrical insulation of the current web from the first semiconductor region takes place by the mirror layer in the isolator fields.

A proportion of the contact fields on the current web along the longitudinal direction may be at least 20% or 25% or 30% or 40%. Alternatively or additionally, this proportion may be at most 70% or 60% or 55% or 45% or 35%. In particular, this proportion of the contact fields is smaller than the corresponding proportion of the isolator fields.

The current web may have a constant width across the contact fields and the isolator fields along the longitudinal direction. That is, the current web can extend in particular as a straight line without a width variation along the contact trench. Equally, the contact trench for the current web can have a not varying, constant width and/or cross-sectional shape. The contact trench preferably runs along a straight line, too.

Alternatively, it is possible for the current web and/or for the contact trench to have a varying width. The width then increases continuously or step wise in the direction away from the bonding region, for example, or the width varies periodically, for example, sinusoidally.

The contact trench in the region of the insulator fields, the insulating trench and the current distribution trench may be of the same depth. This is achieved in that the insulating trench, the current distribution trench and the sections of the contact trench in the isolator fields are generated in the same method step.

The contact trench may have a different depth in the contact fields than in the insulator fields and/or a different depth than the insulating trench and the current distribution trench. In this example, the contact trench in the contact fields is preferably less deep than in the isolator fields. Alternatively, the contact trench in the contact fields can also be deeper than in the isolator fields or can also be of the same depth.

The insulating trench may be narrower than the contact trench seen in a plan view. Alternatively or additionally, the insulating trench may be narrower than the current distribution trench, as seen in a plan view.

The insulating trench forming the closed frame around the contact trench may be located close to the contact trench and/or located comparatively far away from the current distribution trench. In particular, a mean and/or a maximum distance between the insulating trench and the contact trench is at most 50 µm or 30 µm or 20 µm or 10 µm. Alternatively or additionally, a mean and/or a minimum distance between the insulating trench and the contact trench is at least 0.5 µm or 1 µm or 4 µm. With regard to the average and/or minimum distance between the insulating trench and the current distribution trench, alternatively or additionally it applies that the distance is at least 30 µm or 50 µm or 75 µm or 100 µm.

The busbar may be U-shaped when viewed in a plan view. This means that, viewed in a plan view, the busbar preferably forms an arc with an angular overlap of 180°, and the busbar is bent more strongly in a middle part than at end regions, wherein the busbar can run out straight in the end regions. Alternatively, the busbar can have other shapes and can, for example, be L-shaped, H-shaped as well as m-shaped or fork-shaped with two or more than two fingers.

The current web may be located between the limbs of the U of the busbar. In particular, the current web can lie completely within the U of the busbar. If the busbar has other shapes, the current web can also be located within the busbar. In addition, it is alternatively possible that the busbar and the current web are each of L-shaped configuration and lie next to one another or that the busbar and the current web, as seen in a plan view, are shaped in a fork-like or m-like manner with fingers or prongs engaging into one another.

The semiconductor chip, in particular with regard to the electrical contacting, may be symmetrical with respect to a longitudinal axis, along which the current web runs. The longitudinal axis is in particular the axis of symmetry or the axis of the semiconductor chip which is the longest. It is possible for the longitudinal axis to be the single axis of symmetry of the semiconductor chip as seen in a plan view.

The current web may project laterally beyond the contact trench in places or over the entire length of the contact trench. This applies in a plan view and in the direction perpendicular to the longitudinal direction of the current web. This preferably applies continuously along the longitudinal direction in all contact fields.

Viewed in a plan view, the current web may be located in places or entirely in the contact trench. In the direction away from the substrate, the current web preferably projects beyond the contact trench, but can alternatively also lie completely in the contact trench in the direction away from the substrate.

The semiconductor chip may comprise a passivation layer. The passivation layer can be formed from a single layer or a plurality of partial layers. The mirror layer is preferably partially covered by the passivation layer. Recesses for the current web and the busbar are preferably provided in the passivation layer.

The insulating trench may be partially or preferably completely covered by the passivation layer. Furthermore, the contact trench and the current distribution trench are preferably completely covered by the passivation layer together with the current web and together with the busbar. In this example, the busbar is preferably restricted to the current distribution trench, seen in a plan view.

We also provide a method of producing an optoelectronic semiconductor chip. The method preferably produces an optoelectronic semiconductor chip, as specified in connection with one or more of the above-mentioned examples. Features of the method are therefore also disclosed for the optoelectronic semiconductor chip and vice versa.

The method may be configured to produce an optoelectronic semiconductor chip and comprises the following steps, particularly preferably in the order specified:

A) providing a light-transmissive substrate and growing a semiconductor layer sequence on the substrate, wherein the semiconductor layer sequence has an active layer that generates radiation between a first and a second semiconductor region, B) producing a first mask layer on the semiconductor layer sequence and etching an insulating trench and a current distribution trench, C) applying an electrically insulating mirror layer that reflects radiation generated during operation in the active layer in the insulating trench and in the current distribution trench, D) removing the first mask layer and whole-area application of a current spreading layer for the second semiconductor region, E) producing a second mask layer and etching a contact trench that extends like the insulating trench and the current distribution trench from a side of the second semiconductor region remote from the substrate through the active layer into the first semiconductor region so that the contact trench is completely surrounded by the insulating trench and the current distribution trench lies only outside the insulating trench, F) removing the current spreading layer from a region directly at the contact trench, G) removing the second mask layer and producing a passivation layer, and H) producing a third mask layer and removing the passivation layer in places, and applying a metallic current web in the contact trench, the current web is configured for a current conduction along the contact trench and supplies current to the first semiconductor region, and at the same time applies a metallic busbar in the current distribution trench, the busbar is configured for current conduction along the current distribution trench and energizes the second semiconductor region.

With the method, it is possible to achieve a high reflectivity at both electrical contact surfaces for the first and for the second semiconductor region with only three photo layers. This results in high light decoupling efficiency and at the same time in comparatively low production costs.

The method may comprise a step F1) between steps F) and G). In this step, in the contact trench the electrical contact layer is applied directly to the first semiconductor region.

The current spreading layer may be etched, preferably wet-chemically etched in step F). In this example, the second semiconductor region and preferably also the mirror layer are partially freed from the current spreading layer. In this example, the second mask layer is undercut so that an etching region of the current spreading layer extends to below the second mask layer. An overhang of the mirror layer over the current spreading layer, in the direction towards the contact trench, after the etching is preferably at least 0.3 µm or 0.7 µm and/or at most 10 µm or 5 µm.

Our optoelectronic semiconductor chip and our method are explained in more detail below with reference to the drawing on the basis of examples. Identical reference signs indicate the same elements in the individual figures. However, no relationships to scale are illustrated. Rather, individual elements can be represented with an exaggerated size to afford a better understanding.

FIG. 1 shows an example of an optoelectronic semiconductor chip 1. In FIG. 1, five regions A, B, C, D, E are marked. FIGS. 2 to 6 show sectional representations of these regions A, B, C, D, E. The semiconductor chip 1, in particular a light-emitting diode chip, comprises a semiconductor layer sequence 2 on a light-transmissive substrate 3. The semiconductor layer sequence 2 is preferably based on AlInGaN. The substrate 3 is preferably a sapphire growth substrate. During operation, the semiconductor chip 1 preferably generates blue light.

To energize the semiconductor chip 1, a current web 6 having a bonding region 66 and a busbar 8 having a bonding region 88 are provided. The current web 6 is located in a contact trench 41, seen in a plan view. Along a longitudinal direction, the current web 6 alternately has directly successive contact fields 61 and isolator fields 62. A current impression into the semiconductor layer sequence 2 is effected via the current web 6 only in the contact fields 61. In a plan view, the busbar 8 is U-shaped and the current web 6 with the bonding region 66 is located completely within this U.

FIG. 2 shows a sectional view from the region A of FIG. 1. FIG. 2 thus illustrates an edge region of the optoelectronic semiconductor chip 1.

The semiconductor layer sequence 2 comprises an active layer 22, for example, a multi quantum well structure located between a first semiconductor region 21 and a second semiconductor region 23. The first semiconductor region 21 is preferably an n-side and the second semiconductor region 23 is, thus, a p-side of the semiconductor layer sequence 2.

An edge trench 44 is formed at an edge region of the semiconductor chip 1. The second semiconductor region 23 and the active layer 22 are removed from the edge trench 44, the first semiconductor region 21 is only partially present. The substrate 3 is not exposed in the edge trench 44. Furthermore, an electrically insulating mirror layer 5 is located at the edge region, the mirror layer 5 completely covers a flank of the semiconductor layer sequence 2 on which the second semiconductor region 23 and the active layer 22 are exposed.

A current spreading layer 83 consisting of ITO, for example, having a thickness of approximately 80 nm, for example, and a passivation layer 9 extend completely over the edge region. Since in the edge region the mirror layer 5 lies between the first semiconductor region 21 and the current spreading layer 83, no current flow takes place in the edge region. In the edge region, the substrate 3, the first semiconductor region 21, the mirror layer 5, the current spreading layer 83 and the passivation layer 9 each directly follow one another along a growth direction G of the semiconductor layer sequence 2.

The passivation layer 9 is, as preferably also in all other examples, formed from an electrically insulating material and is sealed against moisture and/or oxygen. In particular, the passivation layer 9 is a combination of an inner layer of aluminum oxide, for instance produced with atomic layer deposition, and an outer layer of silicon dioxide located further away from the substrate 3, for instance produced with chemical vapor deposition.

The region B from FIG. 1 is shown in greater detail in FIG. 3. FIG. 3 illustrates the bonding region 88 for the second semiconductor region 23. A corresponding structure having only a reduced width can also be present along the U-shaped arms of the busbar 8.

A current distribution trench 43 is formed in the bonding region and preferably also along the U-shaped arms of the busbar 8. The current distribution trench 43 preferably has the same depth as the edge trench 44 from FIG. 2. The electrically insulating mirror layer 5 is located in the current distribution trench 43, the mirror layer 5 completely covers a base surface and side surfaces of the current distribution trench 43. The current spreading layer 83 extends completely over the current distribution trench 43. A lateral current expansion and power supply of the second semiconductor region 23 are effected by the current spreading layer 83.

The current spreading layer 83 is completely covered by the bonding region 88, or the busbar 8 together with the passivation layer 9. The passivation layer 9 as well as the busbar 8 or the bonding region 88 terminate flush with one another. The busbar 8 and the bonding region 88 can project beyond the semiconductor layer sequence 2 in the direction away from the substrate 3 along the growth direction G. The current spreading layer 83 and the passivation layer 9 overform edges of the current distribution trench 43 with the mirror layer 5 in a shape-retaining manner, as is preferably the case in all other examples.

Figure 4:
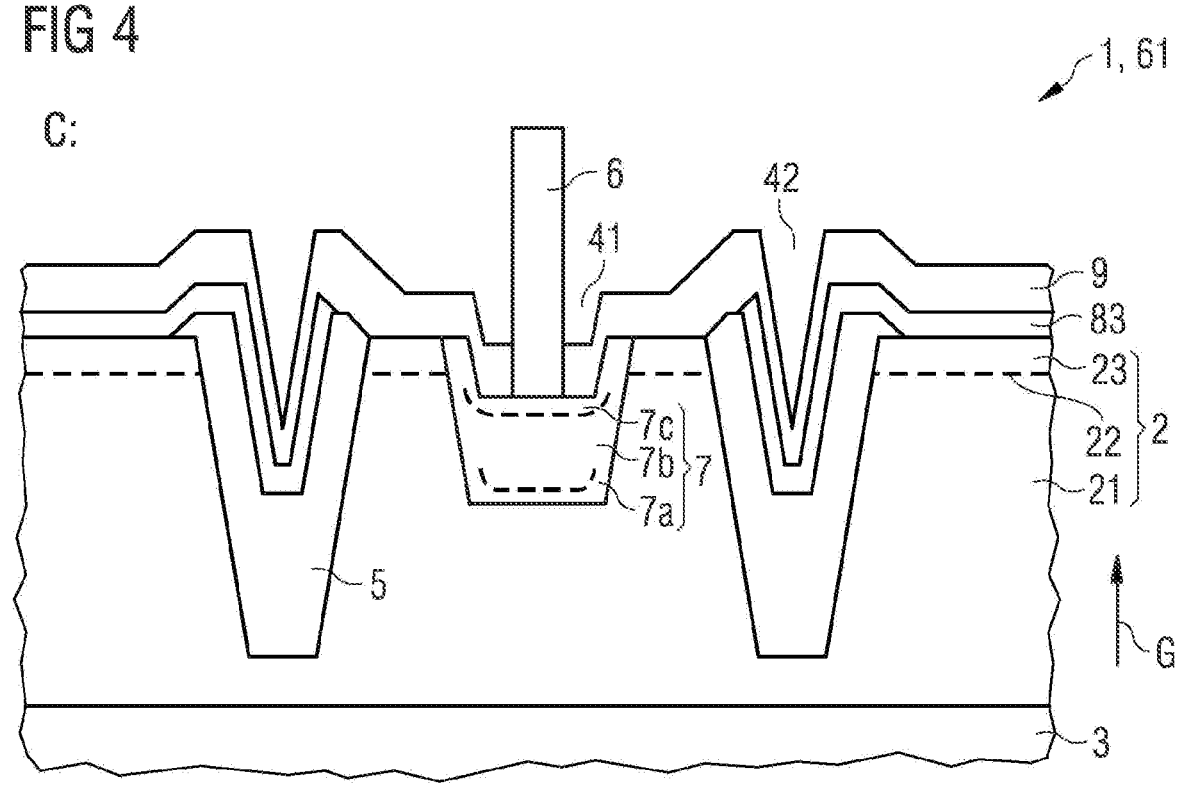

The region C of the current web 6 is shown in FIG. 4. Thus, FIG. 4 represents a sectional view through the current web 6 in the contact field 61.

The current web 6 is located in a contact trench 41. The contact trench 41 extends through the active layer 22 into the first semiconductor region 21. Optionally, a contact layer 7 is present between the first semiconductor region 21 and the current web 6. The contact layer 7 completely covers a base surface and side surfaces of the contact trench 41. Thus, at the contact trench 41 the two semiconductor regions 21, 23 are short-circuited via the preferably metallic, reflective contact layer 7.

To locally limit this short circuit via the contact layer 7, the contact trench 41 is located within a closed frame, formed by the insulating trench 42. According to FIG. 4, the insulating trench 42 is not directly adjacent to the contact trench 41 so that the semiconductor layer sequence 2 is still completely preserved between the insulating trench 42 and the contact trench 41. The isolating trench 42 can extend deeper into the first semiconductor region 21, in the direction of the substrate 3.

The mirror layer 5 is located in the insulating trench 42. On the mirror layer 5, coming from outside the frame formed by the insulating trench 42, the current spreading layer 83 is present. Coming from outside this frame, the current spreading layer 83 only partially covers the mirror layer 5 so that no electrical contact takes place via the current spreading layer 83 between an interior of the frame formed by the insulating trench 42 with an exterior of this frame. The current spreading layer 83 extends beyond the lowest point of the insulating trench 42.

The current web 6 is located directly on the contact layer 7 and has a smaller width than the contact layer 7. Together with the passivation layer 9, the current web 6 covers the region around the contact trench 41 and around the insulating trenches 42 completely.

Optionally, as in all other examples, it is also possible for the contact layer 7 to consist of a semiconductor contact layer 7a, a reflection layer 7b and a barrier layer 7c. The thin semiconductor contact layer 7a is formed, for example, from titanium or chromium. The reflection layer 7b is, for example, a comparatively thick layer of Ag, Al or Rh. The barrier layer 7c contains or consists in particular of titanium or platinum.

The current web 6 is formed, for example, from silver, copper, gold, tin and/or nickel. The mirror layer 5 is preferably a multi-layer mirror formed as a DBR (distributed Bragg reflector). The mirror layer 5 preferably has a comparatively low number of layers, in particular at least two or three or four partial layers. Alternatively or additionally, the mirror layer 5 comprises at most 20 or 12 or six partial layers. The mirror layer 5 preferably has a sequence of dielectric layers having a low and a high refractive index. Low refractive index means, in particular, <1.7, high refractive index means in particular >1.7, relative to a wavelength of maximum intensity of the radiation generated in the semiconductor layer sequence 2 during operation. In relation to this wavelength, a thickness of the individual layers is preferably $\lambda/4$, wherein a lowermost of these layers, closest to the substrate 3, can have a thickness of $3\lambda/4$.

It is possible for the insulating trench 42, unlike in FIG. 4, not only to be partially, but completely filled with the mirror layer 5 together with the current spreading layer 83 and/or the passivation layer 9.

Figure 5:
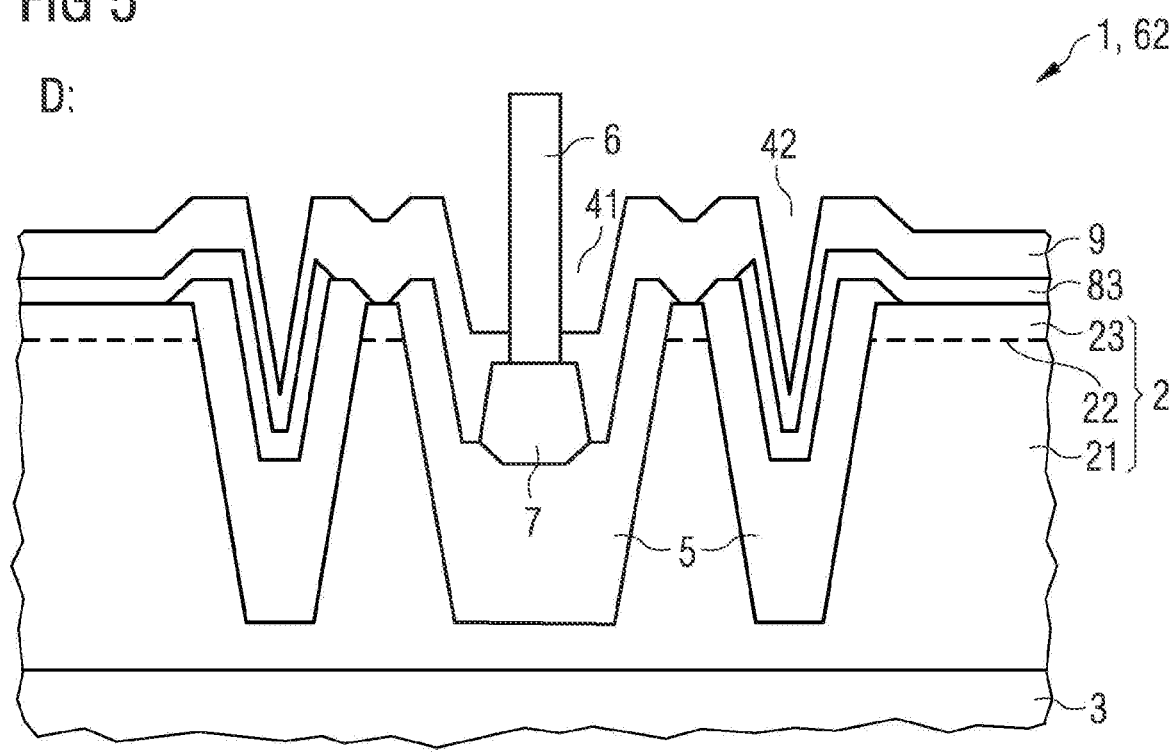

FIG. 5 shows the sectional representation of the region D from FIG. 1. Thus, FIG. 5 represents a sectional view along the current web in the region of the isolator fields 62.

In the insulator field 62 shown, the contact trench 41 has the same depth as the insulating trench 42. In particular, in the insulator field 62 the contact trench 41 and the insulating trench 42 are produced in the same method step and are likewise provided with the mirror layer 5. Thus, deviating from FIG. 4, the contact trench 41 according to FIG. 5 has the same depth as the insulating trench 42 and is additionally filled with the mirror layer 5. In the insulator field 62, the mirror layer 5 in turn completely covers a base surface and side surfaces of the contact trench 41. The side of the second semiconductor region 23 facing away from the substrate 3 is only slightly covered by the mirror layer 5, as is preferable in all other examples.

Optionally, the contact layer 7 is located between the mirror layer 5 and the current web 6. The contact layer 7 can also be omitted from the insulator field 62. The contact layer 7 is completely enclosed in the insulator field 62 by the mirror layer 5 together with the passivation layer 9 and the current web 6.

Figure 6:
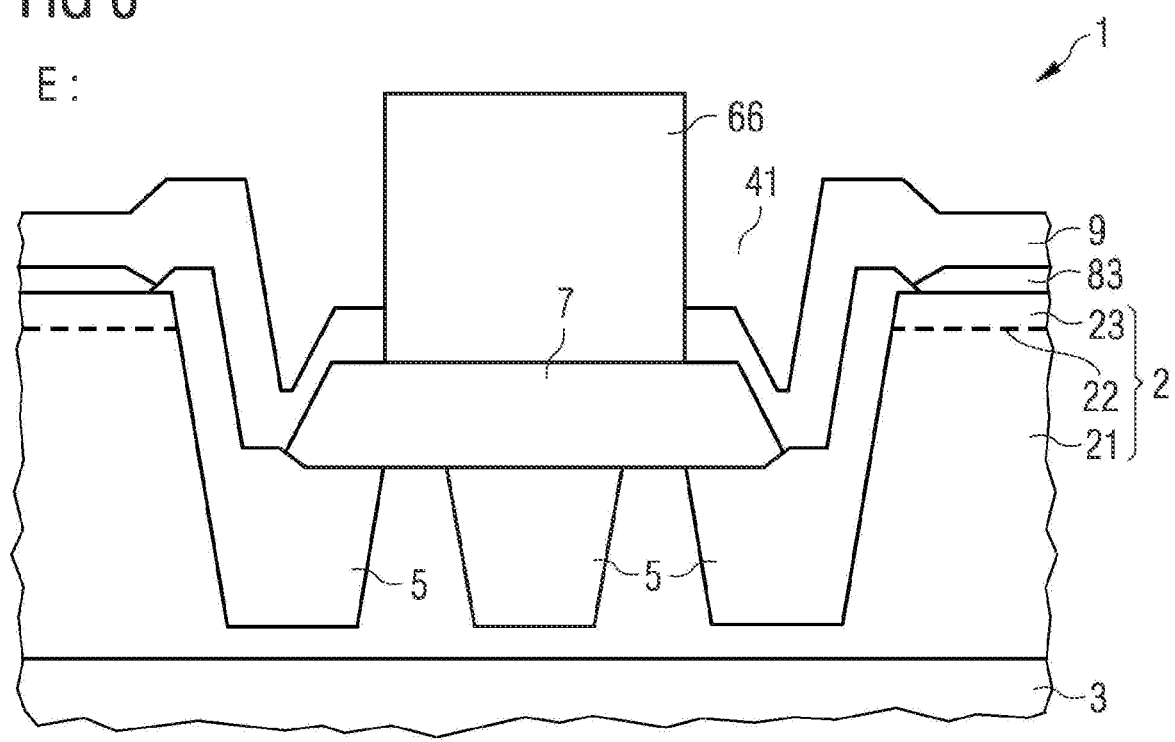

In FIG. 6, the region E around the bonding region 66 for the first semiconductor region 21 is shown. The bonding region 66 is circular when viewed in a plan view. The contact layer 7 is optionally located below the bonding region 66, the contact layer 7 can have a greater width than the bonding region 66. The mirror layer 5 has a circular cutout seen in a plan view so that the mirror layer 5, viewed in cross section, appears divided into three parts. The first semiconductor region 21 encloses a region of the mirror layer 5 which is circular in a plan view.

Figure 7:
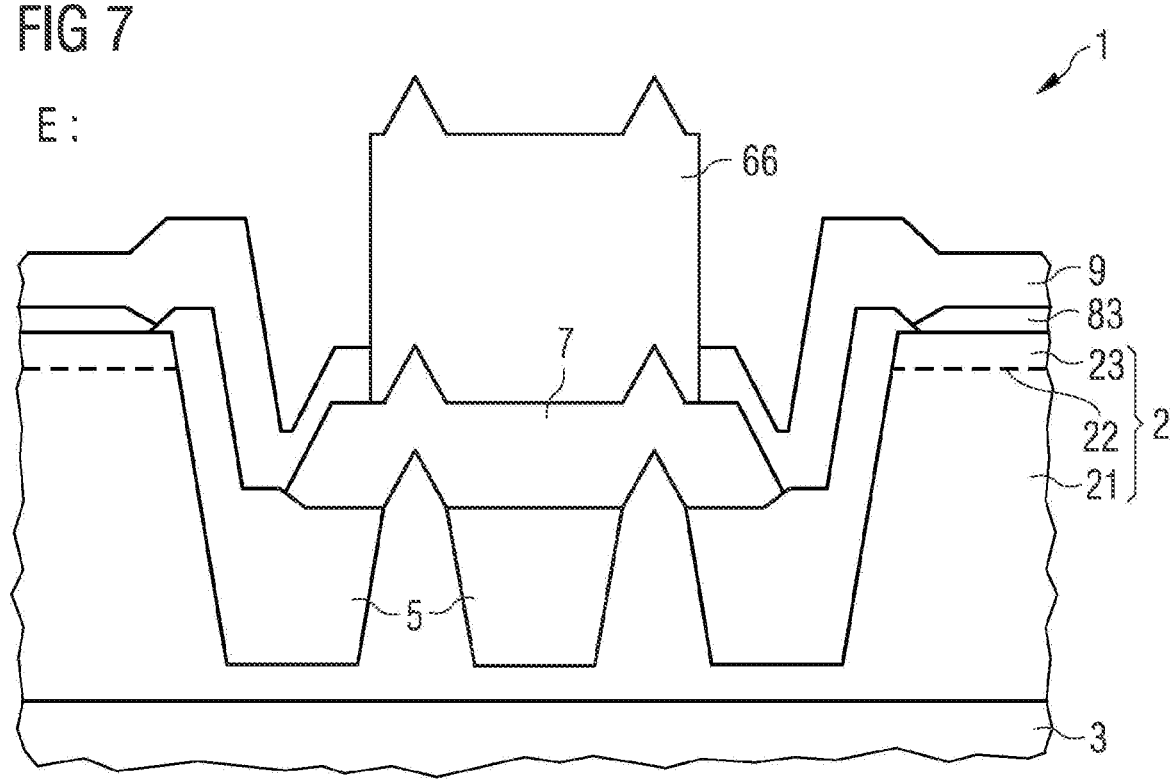

FIG. 7 illustrates a further example of the semiconductor chip 1. The region E from FIG. 1 and thus the bonding region 66 for the first semiconductor region 21 are shown. In contrast to FIG. 6, at the annular cutout in the mirror layer 5 below the bonding region 66, as seen in cross section, triangular bulges of the first semiconductor region 31 into the contact layer 7 are provided. The triangular bulges can continue via the contact layer 7 to an upper side of the bonding region 66 facing away from the substrate 3.

These bulges, which are triangular when viewed in cross section, result from two etching steps, on the one hand for the contact trench 41 in the contact fields 61 and on the other hand from an etching step for the contact trench 41 and the isolating trench 42 in the isolator fields 62. In other words, according to FIG. 7, the isolating trench 42 and the contact trench 41 can touch so that the semiconductor layer sequence 2 is not completely obtained between these trenches 41, 42 at any point, unlike in the representation of FIGS. 4 and 5.

Figure 8:
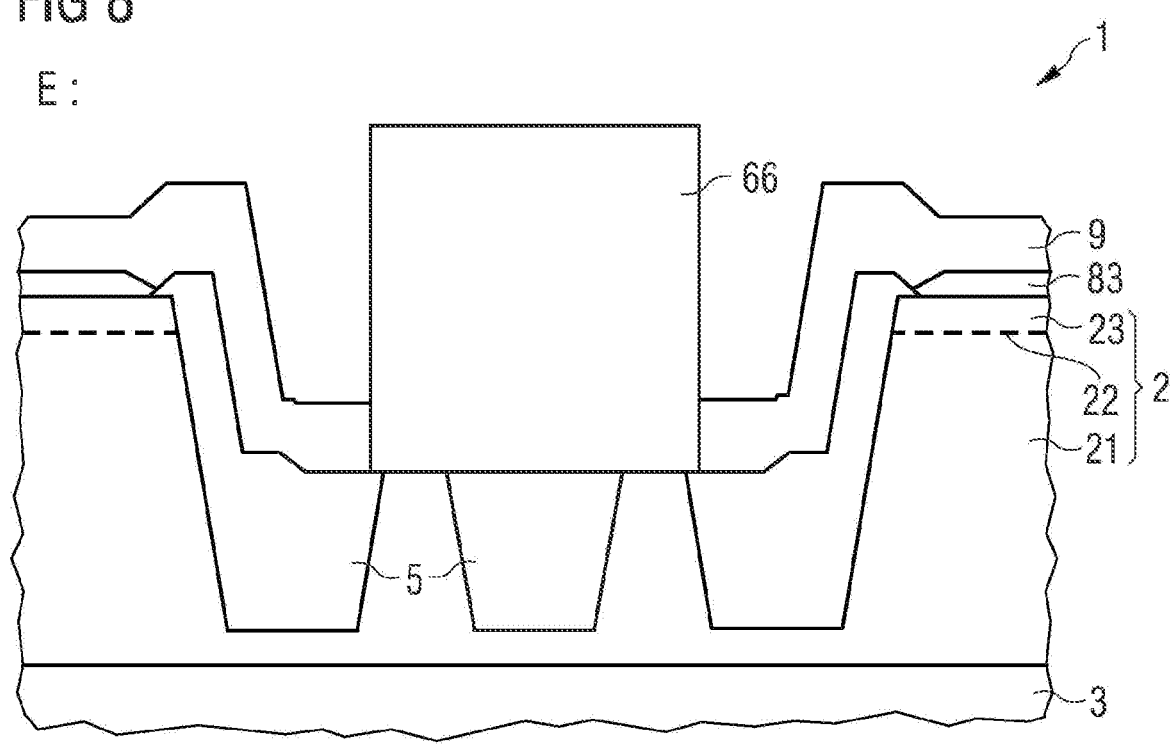

In the example of FIG. 8, no contact layer is present in the bonding region 66. Otherwise, the example of FIG. 8 corresponds to that of FIG. 6.

Deviating from the representation in FIG. 8, it is also possible that, as seen in cross section, triangular bulges of the first semiconductor region 21 are present in the direction away from the substrate 3, too, as shown in connection with FIG. 7, wherein the contact layer 7 is then absent from FIG. 7.

FIG. 9 relates to a further example of the semiconductor chip 1, a sectional illustration in the region C on the contact fields 61 is shown. In contrast to FIG. 4, the current web 6 has a greater width than the contact layer 7. The contact layer 7 in the contact field 61 is thus completely surrounded by the semiconductor layer sequence 2 together with the current web 6 and is not in direct contact with the passivation layer 9. The top side of the contact web 6 facing away from the substrate 3 can be shaped in accordance with a top side of the contact layer 7 facing away from the substrate 3 and thus, on the top side, can have a centered trapezoidal recess which widens in the direction away from the substrate 3. Otherwise, the example of FIG. 9 corresponds to that of FIG. 4.

A further example of the contact field 61 is shown in FIG. 10. Between the contact layer 7 and the semiconductor layer sequence 2, a further passivation layer 91 is located on the side surfaces of the contact trench 41. The further passivation layer 91 is preferably provided with the same etching mask as the contact trench 41 in the contact field 61. The further passivation layer 91 is produced, for example, using an isotropic application method and subsequently etched anisotropically so that the base area of the contact trench 41 is free of the further passivation layer 91. Otherwise, the example of FIG. 10 corresponds to that of FIG. 9.

Such a further passivation layer 91 can also be used when no contact layer 7 is present and the current web 6 extends directly to the base area of the contact trench 41.

FIG. 11 schematically shows a production method for such a semiconductor chip 1, in particular as explained in conjunction with FIGS. 1 to 6. With this method, the semiconductor chip 1 can be produced with only three photo layers, corresponding to three mask layers 11, 12, 13.

In FIG. 11A, one of the contact fields 61 and one of the isolator fields 62 are illustrated. A first mask layer 11 is applied to the semiconductor layer sequence 2. The insulating trenches 42 are subsequently produced and the contact trenches 41, but the latter only in the insulator field 62. According to FIG. 11A, in the same method step the current distribution trench 43 (not shown) and the edge trench 44 are produced, compare FIGS. 2 and 3.

According to FIG. 11B, the mirror layer 5 is applied with the aid of the same first mask layer 11. In FIG. 11B, this is only shown for the contact field 61, and this is done in the same way for the insulator field 62.

In FIG. 11C, it can be seen that the current spreading layer 83 is applied over the whole area, after the first mask layer 11 has been removed.

According to FIG. 11D, a second mask layer 12 is applied. The contact trench 41 in the contact field 61 is produced with the aid of the second mask layer 12. The remaining regions of the semiconductor layer sequence are covered by the second mask layer 12.

After the etching of the contact trench 41, a wet-chemical treatment can be carried out so that the top side of the semiconductor layer sequence 2 facing away from the substrate 3 is freed from the current spreading layer 83 in regions near the contact trench 41 to avoid short circuits.

During this wet-chemical etching, the second mask layer 12 can remain intact. The current spreading layer 83 is etched back to the mirror layer 5 so that the mirror layer 5 projects beyond the current spreading layer 83 by approximately 1 µm in the direction towards the contact trench 41.

Subsequently, the contact layer 7 is applied with the aid of the same second mask layer 12. The method step of FIG. 11E, that is, the application of the contact layer 7, is optional.

In the method step of FIG. 11F, the passivation layer 9 is applied over the whole area after the second mask layer 12 has been removed.

Thereupon, in FIG. 11G, a third mask layer 13 is produced. With the aid of the third mask layer 13, the passivation layer 9 atop the contact layer 7 is opened and the current web 6 is deposited locally.

A wet-chemical or dry-chemical etching can be used to open the passivation layer 9. If the passivation layer 9 has a multi-layer structure, dry-chemical etching is advantageously carried out in order to produce smooth side flanks since wet-chemical etching rates of different dielectrics usually differ from one another Finally, the third mask layer 13 is removed, not shown.

In FIG. 11, only the regions C and D from FIG. 1 are described in more detail. In the remaining regions A, B, E of FIG. 1, the production method of the semiconductor chip 1 is carried out in an analogous manner.

The components shown in the figures follow, unless indicated otherwise, preferably in the specified sequence directly one on top of the other. Layers not in contact in the figures are spaced apart from one another. If lines are drawn parallel to one another, the corresponding surfaces are likewise oriented parallel to one another. Likewise, if not indicated otherwise, The relative thickness ratios, length ratios and positions of the drawn components relative to one another are correctly reproduced in the figures.

Our chips and methods are not restricted by the description on the basis of the examples. Rather, this disclosure encompasses any new feature and also any combination of features including in particular any combination of features in the appended claims, even if the feature or combination itself is not explicitly specified in the claims or examples.

This application claims priority of DE 10 2016 124 860.6, the subject matter of which is incorporated herein by reference.

The invention claimed is:

1. An optoelectronic semiconductor chip comprising:
  a semiconductor layer sequence having an active layer that generates radiation between a first and a second semiconductor region,
  a transparent substrate on which the semiconductor layer sequence is located,
  at least one contact trench,
  at least one insulating trench,
  at least one current distribution trench,
  at least in the insulating trench, an electrically insulating mirror layer that reflects radiation generated in the active layer,
  at least one metallic current web in the contact trench configured for a current conduction along the contact trench and supplying current to the first semiconductor region, and
  at least one metallic busbar in the current distribution trench that energizes the second semiconductor region,
  wherein
  the contact trench, the isolating trench and the current distribution trench extend from a side of the second semiconductor region facing away from the substrate through the active layer into the first semiconductor region, and the contact trench is completely surrounded by the insulating trench, and the current distribution trench lies only outside the insulating trench.

2. The optoelectronic semiconductor chip according to claim 1, wherein the first semiconductor region forms an n-side and the second semiconductor region forms a p-side of the semiconductor layer sequence, the mirror layer is applied directly to the first semiconductor region and extends at least from the insulating trench to the side of the second semiconductor region facing away from the substrate, and said side of the second semiconductor region being covered to at most 5% by the mirror layer.

3. The optoelectronic semiconductor chip according to claim 1, further comprising an electrical contact layer, in direct contact with the current web and with the first semiconductor region and configured to impress current into the first semiconductor region.

4. The optoelectronic semiconductor chip according to claim 3, wherein the contact layer is a metallic layer and, proceeding from a base surface of the contact trench, covers side surfaces of the contact trench at least partially and extends beyond the active layer to the second semiconductor region, and the contact layer is applied directly to the base surface and the side surfaces.

5. The optoelectronic semiconductor chip according to claim 4, wherein at least along the current web, the contact layer is restricted to the contact trench.

6. The optoelectronic semiconductor chip according to claim 1, wherein a plurality of contact fields and isolator fields are arranged alternately along a longitudinal direction of the current web, a current impression directly into the first semiconductor region takes place in the contact fields, and in the insulator fields the first semiconductor region has no direct electrical contact with the current web because of the mirror layer.

7. The optoelectronic semiconductor chip according to claim 6, wherein a proportion of the contact fields at the current web along the longitudinal direction is between 20% to 70%, and the current web has a constant width across the contact fields and the isolator fields along the longitudinal direction.

8. The optoelectronic semiconductor chip according to claim 7, wherein the contact trench in area of the insulator fields, the insulating trench as well as the current distribution trench are of equal depth, and the contact trench in the area of the contact fields is less deep.

9. The optoelectronic semiconductor chip according to claim 1, wherein the insulating trench is narrower than the contact trench and the current distribution trench, and a mean distance between the insulating trench and the contact trench is at most 20 μm, and a mean distance between the insulating trench and the current distribution trench is at least 30 μm.

10. The optoelectronic semiconductor chip according to claim 1, wherein the busbar is U-shaped when viewed in a plan view and the current web is located between limbs of said U, and the semiconductor chip, viewed in a plan view, is configured symmetrically with respect to a longitudinal axis along which the current web runs.

11. The optoelectronic semiconductor chip according to claim 1, wherein the current web proceeds beyond the contact trench at least in places, viewed in a plan view and in the direction perpendicular to the longitudinal direction of the current web.

12. The optoelectronic semiconductor chip according to claim 1, wherein the current web lies completely in the contact trench at least in places, viewed in a plan view.

13. The optoelectronic semiconductor chip according to claim 1, wherein the insulating trench is completely covered by a passivation layer, and the contact trench and the current distribution trench are completely covered by said passivation layer together with the current web and together with the busbar.

14. A method of producing an optoelectronic semiconductor chip comprising in order:

A) providing a transparent substrate and growing a semiconductor layer sequence on the substrate, wherein the semiconductor layer sequence has an active layer that generates radiation between a first and a second semiconductor region, B) producing a first mask layer on the semiconductor layer sequence and etching of an insulating trench and of a current distribution trench, C) applying an electrically insulating mirror layer in the insulating trench and the current distribution trench, the mirror layer is configured to reflect light generated in the active layer during operation, D) removing the first mask layer and applying a current spreading layer over the whole area for the second semiconductor region, E) producing a second mask layer and etching a contact trench which, like the insulating trench and the current distribution trench, extends from a side of the second semiconductor region facing away from a substrate through the active layer into the first semiconductor region so that the contact trench is completely surrounded by the insulating trench, and the current distribution trench lies only outside the insulating trench, F) removing the current spreading layer from a region directly at the contact trench, G) removing the second mask layer and producing a passivation layer, H) producing a third mask layer and removing the passivation layer in places and applying a metallic current web in the contact trench, wherein the current web is configured for a current guidance along the contact trench and supplies current to the first semiconductor region and at the same time applies a metallic busbar in the current distribution trench, and the busbar is configured for a current distribution along the current distribution trench and for current supplied to the second semiconductor region.

15. The method according to claim 14, wherein between steps F) and G) in a step F1), an electrical contact layer configured to impress current into the first semiconductor region is applied in the contact trench directly to the first semiconductor region, and in step H) the current web is produced in direct contact with the contact layer.

16. The method according to claim 15, wherein, in step F), the current spreading layer is etched wet-chemically so that the second semiconductor region and the mirror layer are partially uncovered from the current spreading layer and the second mask layer is undercut so that an etching region of the current spreading layer extends until below the second mask layer.

17. The method according to claim 14, wherein, in step F), the current spreading layer is etched wet-chemically so that the second semiconductor region and the mirror layer are partially uncovered from the current spreading layer and the second mask layer is undercut so that an etching region of the current spreading layer extends until below the second mask layer.

\* \* \* \* \*